(12) United States Patent
Masuda et al.

(10) Patent No.: US 10,600,560 B2
(45) Date of Patent: Mar. 24, 2020

(54) ELECTRONIC COMPONENT INCLUDING OUTER ELECTRODES AND A SHIELD ELECTRODE

(71) Applicant: Murata Manufacturing Co., Ltd., Nagaokakyo-shi, Kyoto-fu (JP)

(72) Inventors: Yutaka Masuda, Nagaokakyo (JP); Kunihiro Miyahara, Nagaokakyo (JP); Yosuke Matsushita, Nagaokakyo (JP); Issei Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 736 days.

(21) Appl. No.: 15/293,427

(22) Filed: Oct. 14, 2016

(65) Prior Publication Data

US 2017/0110240 A1    Apr. 20, 2017

(30) Foreign Application Priority Data

Oct. 16, 2015    (JP) .................................. 2015-204719

(51) Int. Cl.
*H01F 27/34*    (2006.01)
*H01F 27/28*    (2006.01)
(Continued)

(52) U.S. Cl.
CPC ......... *H01F 27/34* (2013.01); *H01F 17/0013* (2013.01); *H01F 27/2804* (2013.01);
(Continued)

(58) Field of Classification Search
CPC ......... H01F 17/0013; H01F 2017/0026; H01F 2017/008; H01F 2027/2809;
(Continued)

(56) References Cited

U.S. PATENT DOCUMENTS 6,583,687 B2 *    6/2003    Nosaka .................... H03H 7/09
                                                    333/175
8,816,797 B2 *    8/2014    Nosaka .................... H03H 5/02
                                                    333/175
(Continued)

FOREIGN PATENT DOCUMENTS

CN    1340877 A    3/2002
CN    101528021 A    9/2009
(Continued)

OTHER PUBLICATIONS

Official Letter filed by a third party in corresponding Japanese Patent Application No. 2016-201071, dated Feb. 7, 2018.

*Primary Examiner* — Thienvu V Tran
*Assistant Examiner* — Nicolas Bellido
(74) *Attorney, Agent, or Firm* — Keating & Bennett, LLP (57) ABSTRACT

An electronic component includes a main body, an inner conductor inside the main body, one or more outer electrodes on a bottom surface of the main body and not provided on four side surfaces of the main body, and a shield electrode covering the four side surfaces of the main body and having a cylindrical or substantially cylindrical shape, the shield electrode not being physically connected to any of the one or more outer electrodes at a surface of the main body and being connected to the inner conductor at a surface of the main body.

20 Claims, 9 Drawing Sheets

(51) Int. Cl.
- *H01G 4/30* (2006.01)
- *H01G 4/40* (2006.01)
- *H05K 9/00* (2006.01)
- *H01F 17/00* (2006.01)
- *H01G 4/012* (2006.01)
- *H01G 4/224* (2006.01)
- *H01F 27/29* (2006.01)

(52) U.S. Cl.
CPC .......... *H01F 27/292* (2013.01); *H01G 4/012* (2013.01); *H01G 4/224* (2013.01); *H01G 4/30* (2013.01); *H01G 4/40* (2013.01); *H05K 9/0064* (2013.01); *H05K 9/0081* (2013.01); *H01F 2017/008* (2013.01); *H01F 2017/0026* (2013.01); *H01F 2027/2809* (2013.01)

(58) Field of Classification Search
CPC .... H01F 27/2804; H01F 27/292; H01F 27/34; H01G 4/012; H01G 4/224; H01G 4/30; H01G 4/40; H01L 23/552; H01L 23/66; H01L 2924/00; H01L 2924/0002; H01L 2924/09701; H01L 2924/15311; H01L 2924/3011; H01P 1/203; H01P 1/20381; H01P 1/2135; H01P 5/10; H03H 2001/0085; H03H 5/02; H03H 7/0115; H03H 7/075; H03H 7/09; H03H 7/1708; H03H 7/1758; H03H 7/1766; H03H 7/1775; H03H 7/1783; H03H 7/38; H03H 7/42; H03H 7/463; H05K 9/0064; H05K 9/0081

See application file for complete search history.

(56) References Cited

U.S. PATENT DOCUMENTS

| | | | |
|---|---|---|---|
| 9,184,720 B2* | 11/2015 | Taniguchi | H03H 7/0115 |
| 2002/0101303 A1 | 8/2002 | Tojyo | |
| 2003/0147197 A1* | 8/2003 | Uriu | H01P 1/20345 |
| | | | 333/185 |
| 2007/0296534 A1* | 12/2007 | Carastro | H01F 17/0013 |
| | | | 336/200 |
| 2008/0150095 A1 | 6/2008 | Yang et al. | |
| 2009/0223711 A1 | 9/2009 | Ueno et al. | |
| 2010/0230789 A1 | 9/2010 | Yorita et al. | |
| 2011/0102124 A1* | 5/2011 | Matsushita | H01F 17/0013 |
| | | | 336/200 |
| 2013/0170172 A1 | 7/2013 | Reitlinger et al. | |
| 2013/0294009 A1* | 11/2013 | Takeuchi | H01G 4/008 |
| | | | 361/305 |
| 2014/0252595 A1 | 9/2014 | Yen et al. | |
| 2015/0126134 A1* | 5/2015 | Lobianco | H01L 23/3121 |
| | | | 455/73 |
| 2018/0351529 A1* | 12/2018 | Miyahara | H01G 4/40 |

FOREIGN PATENT DOCUMENTS

| | | |
|---|---|---|
| CN | 101840910 A | 9/2010 |
| CN | 104037166 A | 9/2014 |
| JP | 09-121093 A | 5/1997 |
| JP | 2002-076704 A | 3/2002 |
| JP | 2006-156946 A | 6/2006 |
| JP | 2006-211613 A | 8/2006 |
| JP | 2007-073883 A | 3/2007 |
| JP | 2009-099766 A | 5/2009 |
| JP | 2013-534366 A | 9/2013 |
| WO | 01/69710 A1 | 9/2001 |

\* cited by examiner

ELECTRONIC COMPONENT INCLUDING OUTER ELECTRODES AND A SHIELD ELECTRODE

CROSS REFERENCE TO RELATED APPLICATIONS

This application claims the benefit of priority to Japanese Patent Application 2015-204719 filed on Oct. 16, 2015, the entire contents of which application are hereby incorporated herein by reference.

BACKGROUND OF THE INVENTION

1. Field of the Invention

The present invention relates to an electronic component in which an outer electrode is included on a bottom surface thereof.

2. Description of the Related Art

Figure 7:
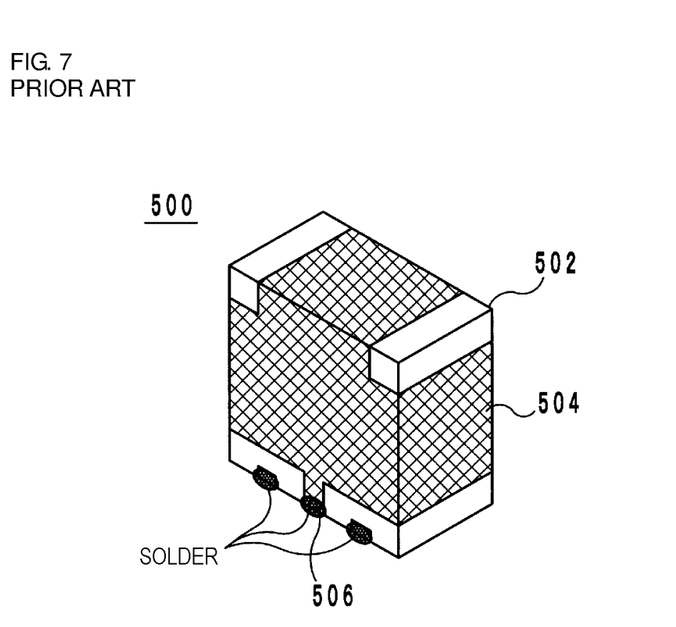
FIG. 7 is an external perspective view of an electronic component of the related art.

For example, a shielded multilayer electronic component (hereafter, simply referred to as "electronic component") disclosed in Japanese Unexamined Patent Application Publication No. 9-121093 is known as an example of an invention relating to an electronic component of the related art. FIG. 7 is an external perspective view of an electronic component 500 disclosed in Japanese Unexamined Patent Application Publication No. 9-121093.

As illustrated in FIG. 7, the electronic component 500 includes a main body 502, a ground electrode 504 and an outer electrode 506. The main body 502 has a substantially rectangular parallelepiped shape. The outer electrode 506 is provided on a bottom surface of the main body 502 and is folded over so as to slightly extend onto side surfaces of the main body 502. The ground electrode 504 is provided on surfaces of the main body 502 other than the bottom surface of the main body 502 (in other words, the upper surface and the four side surfaces). Furthermore, the ground electrode 504 is physically connected to the outer electrode 506. Thus, when the outer electrode 506 is connected to the ground potential, the ground electrode 504 is maintained at the ground potential via the outer electrode 506. Consequently, a high shielding effect can be obtained in the electronic component 500.

However, it is difficult to mount the electronic component 500 disclosed in Japanese Unexamined Patent Application Publication No. 9-121093 on a circuit board so as to be close to other electronic components. In more detail, in the electronic component 500, the ground electrode 504 is physically connected to the outer electrode 506. Consequently, as illustrated in FIG. 7, when the electronic component 500 is mounted on a circuit board, solder wets the outer electrode 506 and the ground electrode 504 provided on the side surfaces of the main body 502. Therefore, when the electronic component 500 and another electronic component are mounted on a circuit board, it is necessary that the electronic component 500 and the other electronic component be arranged so as to be spaced apart from each other such that the solder attached to the electronic component 500 does not contact the other electronic component.

SUMMARY OF THE INVENTION

Accordingly, preferred embodiments of the present invention provide an electronic component that can be mounted on a circuit board so as to be close to or adjacent to another electronic component and that has an improved shielding effect.

An electronic component according to a preferred embodiment of the present invention includes: a main body preferably with a rectangular or substantially rectangular parallelepiped shape; an inner conductor that is provided inside the main body; one or more outer electrodes that are provided on a bottom surface of the main body and are not provided on four side surfaces of the main body; and a shield electrode that covers the four side surfaces of the main body and has a cylindrical or substantially cylindrical shape, wherein the shield electrode is not being physically connected to any of the one or more outer electrodes at a surface of the main body and is connected to the inner conductor at a surface of the main body.

According to a preferred embodiment of the present invention, an electronic component is able to be mounted on a circuit board so as to be close to or adjacent to other electronic components and an improved shielding effect is achieved.

The above and other elements, features, steps, characteristics and advantages of the present invention will become more apparent from the following detailed description of the preferred embodiments of the present invention with reference to the attached drawings.

DETAILED DESCRIPTION OF THE PREFERRED EMBODIMENTS

First Preferred Embodiment

Figure 1A:
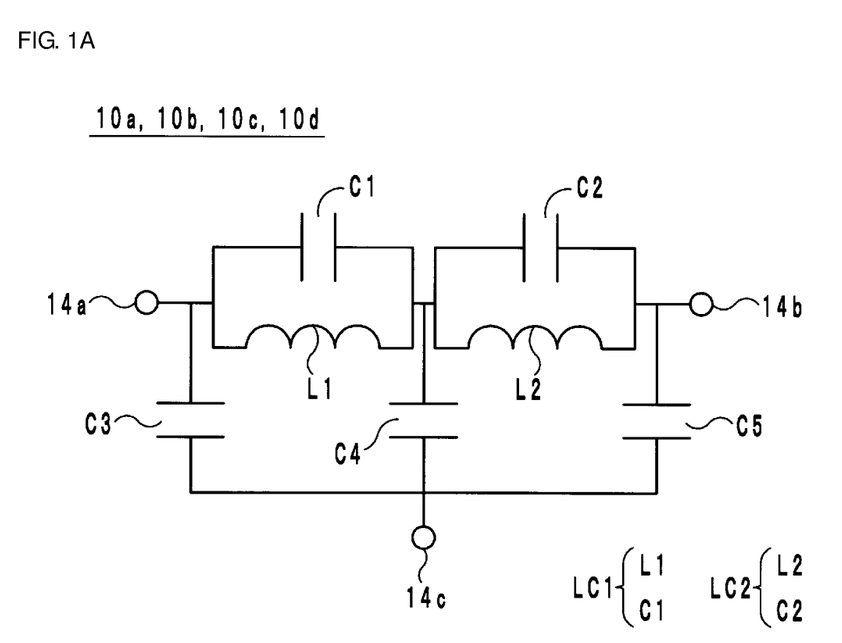
FIG. 1A is an equivalent circuit diagram of electronic components according to various preferred embodiments of the present invention.

Hereafter, an electronic component according to a first preferred embodiment of the present invention will be described while referring to the drawings. FIG. 1A is an equivalent circuit diagram of electronic components 10a to 10d according to the preferred embodiments of the present invention.

The electronic component 10a preferably includes a low pass filter that includes a plurality of passive elements. As illustrated in FIG. 1A, the electronic component 10a includes LC parallel resonators LC1 and LC2, capacitors C3 to C5 (examples of passive elements) and outer electrodes 14a to 14c. The outer electrodes 14a and 14b are input/output outer electrodes through which high-frequency signals are input and output and the outer electrode 14c is a ground outer electrode that is connected to the ground potential.

The LC parallel resonators LC1 and LC2 are serially connected to each other in this order between the outer electrode 14a and the outer electrode 14b. The LC parallel resonator LC1 includes an inductor L1 (an example of a passive element) and a capacitor C1 (an example of a passive element).

The inductor L1 and the capacitor C1 are connected in parallel with each other. The LC parallel resonator LC2 includes an inductor L2 (an example of a passive element) and a capacitor C2 (an example of a passive element). The inductor L2 and the capacitor C2 are connected in parallel with each other.

One electrode of the capacitor C3 is connected to the outer electrode 14a and the other electrode of the capacitor C3 is connected to the outer electrode 14c. One electrode of the capacitor C4 is connected between the LC parallel resonator LC1 and the LC parallel resonator LC2 and the other electrode of the capacitor C4 is connected to the outer electrode 14c. One electrode of the capacitor C5 is connected to the outer electrode 14b and the other electrode of the capacitor C5 is connected to the outer electrode 14c.

Figure 1B:
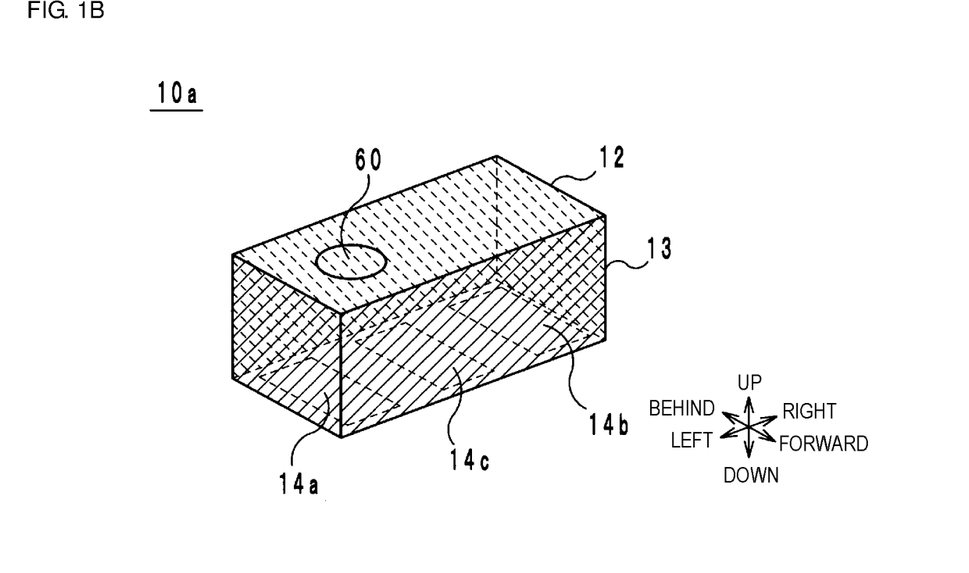
FIG. 1B is an external perspective view of an electronic component according to the first preferred embodiment of the present invention.
Figure 2:
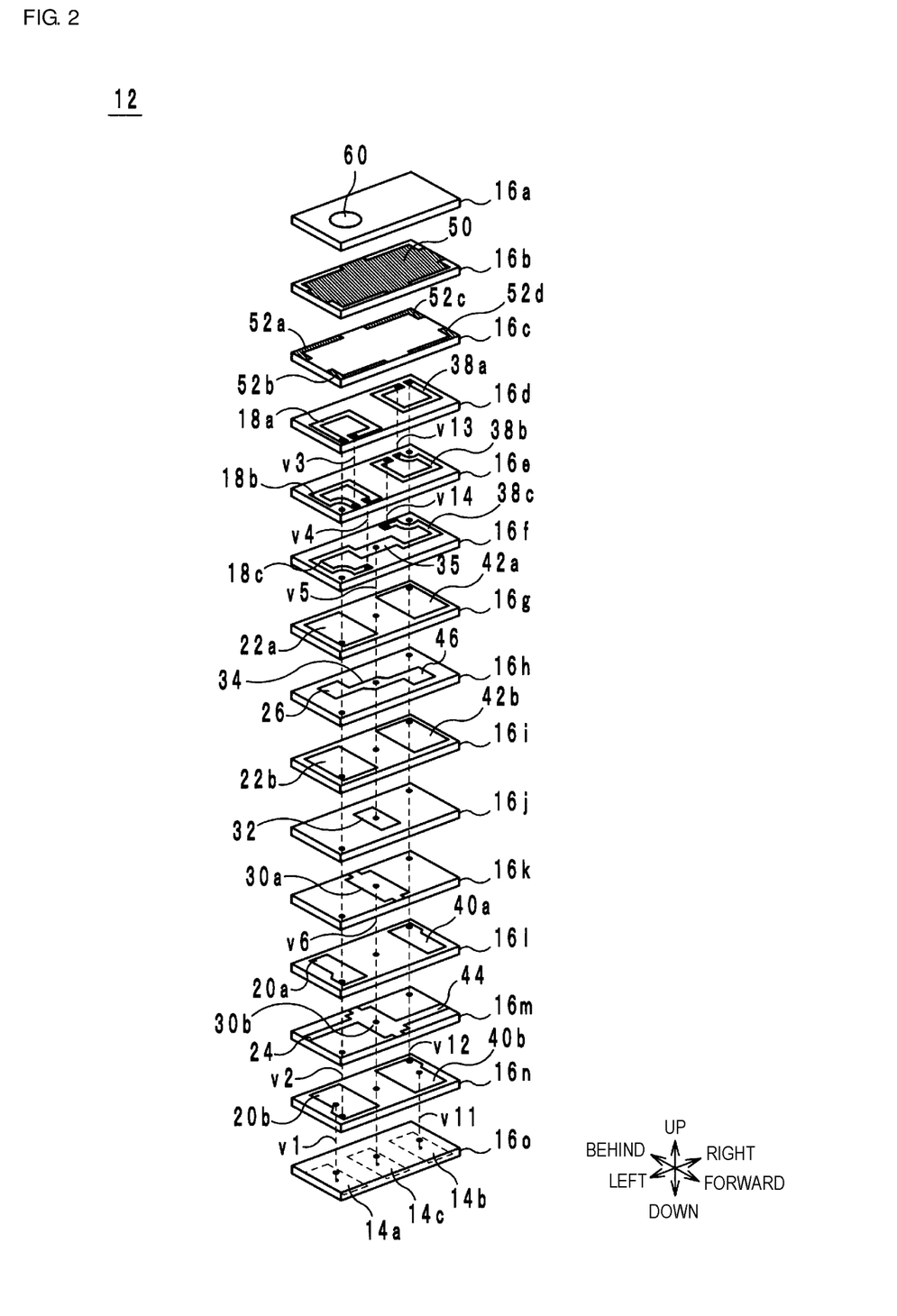
FIG. 2 is an exploded perspective view of an electronic component according to a preferred embodiment of the present invention.

Next, the electronic component 10a will be described while referring to the drawings. FIG. 1B is an external perspective view of the electronic component 10a. FIG. 2 is an exploded perspective view of the electronic component 10a. In FIG. 2, ground conductor layers 50 and 52a to 52d are shaded with hatching to facilitate ease of understanding. Hereafter, a stacking direction of the electronic component 10a is defined as an up-down direction (or direction connecting top surface and bottom surface), a direction in which the long sides of the electronic component 10a extend when looking from above is defined as a left-right direction and a direction in which the short sides of the electronic component 10a extend when looking from above is defined as a forward-behind direction. The up-down direction, the left-right direction and the forward-behind direction are perpendicular to each other.

As illustrated in FIG. 1B and FIG. 2, the electronic component 10a includes a multilayer body 12 (an example of a main body), a shield electrode 13, the outer electrodes 14a to 14c, inductor conductor layers 18a to 18c and 38a to 38c, capacitor conductor layers 20a, 20b, 22a, 22b, 26, 32, 40a, 40b, 42a, 42b and 46, connection conductor layers 34 and 35, ground conductor layers 24, 30a, 30b, 44, 50, and 52a to 52d, an orientation identifying mark 60 and via hole conductors v1 to v6 and v11 to v14.

As illustrated in FIG. 2, the multilayer body 12 is preferably formed by stacking a plurality of insulator layers 16a to 16o from a top side to a bottom side in this order and has a rectangular or substantially rectangular parallelepiped shape, for example. The multilayer body 12 is preferably chamfered by being subjected to barrel finishing. Therefore, corners and edges of the multilayer body 12 are preferably rounded. The multilayer body 12 includes a top surface, a bottom surface and four side surfaces (a front surface, a back surface, a right surface, a and left surface). The insulator layers 16a to 16o are preferably dielectric layers preferably with a rectangular or substantially rectangular shape. Hereafter, main surfaces of the insulator layers 16a to 16o on the upper side will be referred to as upper surfaces and main surfaces of the insulator layers 16a to 16o on the lower side will be referred to as lower surfaces.

The outer electrodes 14a, 14c, and 14b that are preferably of a rectangular or substantially rectangular shape are provided side by side in this order from the left side to the right side on the bottom surface of the multilayer body 12. The outer electrodes 14a to 14c are preferably provided only on the bottom surface of the multilayer body 12 and are preferably not provided on the front surface, the back surface, the left surface and the right surface of the multilayer body 12. The outer electrodes 14a to 14c are preferably fabricated by forming Ni plating and one of Sn plating and Au plating on a base electrode composed of Ag or Cu.

The shield electrode 13 covers the entirety or substantially the entirety of the four side surfaces (the front surface, the back surface, the right surface and the left surface) of the multilayer body 12 and is of a rectangular or substantially rectangular cylindrical shape. Thus, a portion of the shield electrode 13 provided on the front surface and a portion of the shield electrode 13 provided on the left surface are connected to each other at an edge between the front surface and the left surface. The portion of the shield electrode 13 provided on the left surface and a portion of the shield electrode 13 provided on the back surface are connected to each other at an edge between the left surface and the back surface. The portion of the shield electrode 13 provided on the back surface and a portion of the shield electrode 13 provided on the right surface are connected to each other at an edge between the back surface and the right surface. The portion of the shield electrode 13 provided on the right surface and the portion of the shield electrode 13 provided on the front surface are connected to each other at an edge between the right surface and the front surface. However, the shield electrode 13 is preferably not provided on the top surface and the bottom surface of the multilayer body 12. Thus, the shield electrode has a rectangular or substantially rectangular cylindrical shape.

In addition, the shield electrode 13 is preferably not physically connected to any of the outer electrodes 14a to 14c at the surfaces of the multilayer body 12 (that is, the top surface, the bottom surface, the front surface, the back surface, the right surface, and the left surface). Therefore, as illustrated in FIG. 1B, there are spaces between the shield electrode 13 and the outer electrodes 14a to 14c on the bottom surface of the multilayer body 12. The shield electrode 13 is preferably fabricated by applying a conductive paste such as an Ag paste to the four side surfaces of the multilayer body 12, for example. Furthermore, the shield electrode 13 is preferably fabricated by forming metal films such as copper and stainless steel foils on the four side surfaces of the multilayer body 12 by using a sputtering method, for example. In the case where the shield electrode 13 is fabricated using a sputtering method, the top surface and the bottom surface of the multilayer body 12 are preferably masked.

The capacitor conductor layers 20a and 20b and the ground conductor layer 24 are included in the capacitor C3. The capacitor conductor layers 20a and 20b are preferably rectangular or substantially rectangular conductor layers that are respectively provided on the left halves of the upper surfaces of the insulator layers 16l and 16n. The capacitor conductor layers 20a and 20b are superposed with each other when viewed from above.

The ground conductor layer 24 is provided on the left half of the upper surface of the insulator layer 16m. The ground conductor layer 24 is superposed with the capacitor conductor layers 20a and 20b when viewed from above. Thus, the ground conductor layer 24 opposes the capacitor conductor layer 20a with the insulator layer 16l interposed therebetween and opposes the capacitor conductor layer 20b with the insulator layer 16m interposed therebetween.

Furthermore, a left end of the ground conductor layer 24 is positioned at a left short edge of the insulator layer 16*m*. Thus, the left end of the ground conductor layer 24 is exposed to the region outside the multilayer body 12 and is connected to the shield electrode 13 at the left surface of the multilayer body 12.

One electrode of the capacitor C3 (one of capacitor conductor layers 20*a* and 20*b*, for example) is connected to the outer electrode 14*a* through the via hole conductors v1 and v2. The via hole conductor v1 penetrates through the insulator layers 16*n* and 16*o* in the up-down direction and connects the capacitor conductor layer 20*b* and the outer electrode 14*a* to each other. The via hole conductor v2 penetrates through the insulator layers 16*d* to 16*m* in the up-down direction and connects the capacitor conductor layer 20*a* and the capacitor conductor layer 20*b* to each other. Thus, the outer electrode 14*a* and the capacitor conductor layers 20*a* and 20*b* are electrically connected to each other.

The other electrode of the capacitor C3 (the ground conductor layer 24) is connected to the outer electrode 14*c* via the ground conductor layer 30*b* and the via hole conductor v6. The ground conductor layer 30*b* is a rectangular or substantially rectangular conductor layer that is provided in the center of the upper surface of the insulator layer 16*m*. A right end of the ground conductor layer 24 is connected to the ground conductor layer 30*b*. The via hole conductor v6 penetrates through the insulator layers 16*k* to 16*o* in the up-down direction and connects the ground conductor layer 30*b* and the outer electrode 14*c* to each other. Thus, the outer electrode 14*c* and the ground conductor layer 24 are electrically connected to each other.

In addition, the ground conductor layer 30*b* extends to a front long edge and a back long edge of the insulator layer 16*m*. Thus, the ground conductor layer 30*b* is exposed to the region outside the multilayer body 12 and is connected to the shield electrode 13 at the front surface and the back surface of the multilayer body 12.

As described above, the ground conductor layers 24 and 30*b* and the via hole conductor v6, which are examples of an inner conductor, electrically connect the shield electrode 13 and the outer electrode 14*c* to each other. The inner conductor may preferably be made of copper, for example.

The inductor conductor layers 18*a* to 18*c* and the via hole conductors v3 and v4 are included in the inductor L1. The inductor conductor layers 18*a* to 18*c* are respectively provided on the left halves of the upper surfaces of the insulator layer 16*d* to 16*f* and are line-shaped conductor layers each having a shape obtained by removing part of a rectangular or substantially rectangular annular shape. The inductor conductor layers 18*a* to 18*c* are superposed with one another when viewed from above and form a rectangular or substantially rectangular annular shaped track. Hereafter, end portions of the inductor conductor layers 18*a* to 18*c* on the upstream side in a clockwise direction will be referred to as "upstream ends" and end portions of the inductor conductor layers 18*a* to 18*c* on the downstream side in the clockwise direction will be referred to as "downstream ends".

The via hole conductor v3 penetrates through the insulator conductor layer 16*d* in the up-down direction and connects the downstream end of the inductor conductor layer 18*a* and the upstream end of the inductor conductor layer 18*b* to each other. The via hole conductor v4 penetrates through the insulator conductor layer 16*e* in the up-down direction and connects the downstream end of the inductor conductor layer 18*b* and the upstream end of the inductor conductor layer 18*c* to each other. Thus, the inductor L1 has a spiral or substantially spiral shape that advances downward while turning in the clockwise direction when viewed from above.

The capacitor conductor layers 22*a*, 22*b*, and 26 are included in the capacitor C1. The capacitor conductor layers 22*a* and 22*b* are rectangular or substantially rectangular conductor layers that are respectively provided on the left halves of the upper surfaces of the insulator layers 16*g* and 16*i*. The capacitor conductor layers 22*a* and 22*b* have the same shape or substantially the same shape and are superposed so as to be aligned with each other when viewed from above.

The capacitor conductor layer 26 is a rectangular or substantially rectangular conductor layer that is provided on the left half of the upper surface of the insulator layer 16*h*. The capacitor conductor layer 26 is superposed with the capacitor conductor layers 22*a* and 22*b* when viewed from above. Thus, the capacitor conductor layer 26 opposes the capacitor conductor layer 22*a* with the insulator layer 16*g* interposed therebetween and opposes the capacitor conductor layer 22*b* with the insulator layer 16*h* interposed therebetween.

The via hole conductor v2 is connected to the capacitor conductor layers 22*a* and 22*b* and to the upstream end of the inductor conductor layer 18*a*. In addition, the via hole conductor v2 is connected to the capacitor conductor layers 20*a* and 20*b* and the outer electrode 14*a* via the via hole conductor v1. Therefore, the capacitor conductor layers 22*a* and 22*b* and the upstream end of the inductor conductor layer 18*a* are electrically connected to the outer electrode 14*a*.

The connection conductor layer 34 is a band-shaped or substantially band-shaped conductor layer that is provided in the center of the upper surface of the insulator layer 16*h* and extends in the left-right direction. A left end of the connection conductor layer 34 is connected to the capacitor conductor layer 26. The connection conductor layer 35 is a band-shaped or substantially band-shaped conductor layer that is provided in the center of the upper surface of the insulator layer 16*f* and extends in the left-right direction. A left end of the connection conductor layer 35 is connected to the downstream end of the inductor conductor layer 18*c*. The via hole conductor v5 penetrates through the insulator layers 16*f* to 16*i* in the up-down direction. The via hole conductor v5 is connected to the connection conductor layers 34 and 35. Therefore, the capacitor conductor layer 26 and the downstream end of the inductor conductor layer 18*c* are electrically connected to each other.

The ground conductor layer 30*a* and the capacitor conductor layer 32 are included in the capacitor C4. The ground conductor layer 30*a* is a rectangular or substantially rectangular conductor layer that is provided in the center of the upper surface of the insulator layer 16*k*. The capacitor conductor layer 32 is a rectangular or substantially rectangular conductor layer that is provided in the center of the upper surface of the insulator layer 16*j*. The capacitor conductor layer 32 is superposed with the ground conductor layer 30*a* when viewed from above. Thus, the capacitor conductor layer 32 opposes the ground conductor layer 30*a* with the insulator layer 16*j* interposed therebetween.

One electrode of the capacitor C4 (the capacitor conductor layer 32) and the other end of the inductor L1 (the downstream end of inductor conductor layer 18*c*) are connected to each other via the connection conductor layer 35 and the via hole conductor v5. In more detail, the via hole conductor v5 is connected to the capacitor conductor layer 32. In addition, the via hole conductor v5 is connected to the downstream end of the inductor conductor layer 18*c* via the connection conductor layer 35. Therefore, the capacitor conductor layer 32 and the downstream end of the inductor conductor layer 18c are electrically connected to each other.

The other electrode of the capacitor C4 (the ground conductor layer 30a) is connected to the outer electrode 14c via the via hole conductor v6.

The inductor L1 and the capacitors C1 and C3 and the inductor L2 and the capacitors C2 and C5 have a point symmetry relationship about the crossing point of diagonals of the top surface of the multilayer body 12 when viewed from above. The phrase "point symmetry relationship" means that if the inductor L1 and the capacitors C1 and C3 were rotated by 180° about the crossing point of the diagonals of the top surface of the multilayer body 12, the inductor L1 and the capacitors C1 and C3 would be aligned with the inductor L2 and the capacitors C2 and C5. In more detail, the inductor conductor layers 38a to 38c and the inductor conductor layers 18a to 18c have a point symmetry relationship with each other. The capacitor conductor layers 20a, 20b, 22a, 22b and 26 and the ground conductor layer 24 and the capacitor conductor layers 40a, 40b, 42a, 42b and 46 and the ground conductor layer 44 have a point symmetry relationship with each other. The via hole conductors v1 to v4 and the via hole conductors v11 to v14 have a point symmetry relationship with each other. Further detailed description is omitted for the inductor L2 and the capacitors C2 and C5.

The ground conductor layer 50 (an example of a first ground conductor) is provided on the upper surface of the insulator layer 16b (an example of a first insulator layer), which is positioned closer to the top surface of the multilayer body 12 than the inductors L1 and L2 and the capacitors C1 to C5 (examples of passive elements). The ground conductor layer 50 covers a portion of the upper surface of the insulator layer 16b and in this preferred embodiment covers substantially the entirety of the upper surface of the insulator layer 16b. However, the ground conductor layer 50 extends up to the four edges of the insulator layer 16b only at the centers of the four edges. In other words, there are gaps between the outer edge of the ground conductor layer 50 and the four edges of the insulator layer 16b at portions of the four edges of the insulator layer 16b other than the centers of the four edges. Thus, the ground conductor layer 50 is exposed to the region outside the multilayer body 12 and is connected to the shield electrode 13 at the front surface, the back surface, the right surface and the left surface of the multilayer body 12. It is preferable that the ground conductor layer 50 be provided at a position that is within about 200 µm from the top surface of the multilayer body 12, but may be provided at a position that is about 300 to about 400 µm from the top surface of the multilayer body 12, for example.

The ground conductor layers 52a to 52d (an example of a second ground conductor) are provided on the upper surface of the insulator layer 16c (an example of a second insulator layer), which is a different layer from the insulator layer 16b on which the ground conductor layer 50 is provided and is arranged closer to the top surface of the multilayer body 12 than the inductors L1 and L2 and the capacitors C1 to C5 (examples of passive elements). The ground conductor layers 52a to 52d each cover a portion of the upper surface of the insulator layer 16c and are L shaped or substantially L shaped, for example. The ground conductor layer 52a extends along a back half of the left short edge and a left half of the back long edge of the insulator layer 16c. The ground conductor layer 52b extends along a front half of the left short edge and a left half of the front long edge of the insulator layer 16c. The ground conductor layer 52c extends along a back half of the right short edge and a right half of the back long edge of the insulator layer 16c. The ground conductor layer 52d extends along a front half of the right short edge and a right half of the front long edge of the insulator layer 16c. Thus, the ground conductor layers 52a to 52d are exposed to the region outside the multilayer body 12 and are connected to the shield electrode 13 at the front surface, the back surface, the right surface and the left surface of the multilayer body 12. In addition, the ground conductor layer 50 and the ground conductor layers 52a to 52d are collectively superposed with the entire or substantially the entire top surface of the multilayer body 12 when viewed from above.

The orientation identifying mark 60 is a circular or substantially circular conductor layer that is provided on the top surface of the multilayer body 12 (upper surface of insulator layer 16a). The orientation identifying mark 60 is preferably used when identifying the orientation of the electronic component 10a.

The inductor conductor layers 18a to 18c and 38a to 38c, the capacitor conductor layers 20a, 20b, 22a, 22b, 26, 32, 40a, 40b, 42a, 42b and 46, the connection conductor layers 34 and 35, the ground conductor layers 24, 30a, 30b, 44, 50, and 52a to 52d, the orientation identifying mark 60 and the via hole conductors v1 to v6 and v11 to v14 are preferably fabricated using a conductive material such as Cu, for example.

The electronic component 10a according to a preferred embodiment of the present invention is able to be mounted on a circuit board so as to be close to or adjacent to other electronic components, as will be described below. The shield electrode 13 of the electronic component 10a is preferably not physically connected to any of the outer electrodes 14a to 14c at the surfaces of the multilayer body 12. Therefore, there are spaces between the shield electrode 13 and the outer electrodes 14a to 14c on the bottom surface of the multilayer body 12. Consequently, the occurrence of a situation in which solder provided on the outer electrodes 14a to 14c becomes attached to the shield electrode 13 when mounting the electronic component 10a on a circuit board using solder is significantly reduced or prevented. In other words, the occurrence of a situation in which the solder wets the side surfaces of the multilayer body 12 is significantly reduced or prevented. Thus, the occurrence of a situation in which the solder contacts another electronic component is significantly reduced or prevented even when the other electronic component is close to or adjacent to the electronic component 10a. As a result, the electronic component 10a is able to be mounted on the circuit board so as to be close to or adjacent to other electronic components.

In addition, the electronic component 10a achieves an improved shielding effect and therefore is able to significantly reduce or prevent entry of noise from the outside and radiation of noise to the outside. In more detail, the shield electrode 13 of the electronic component 10a covers the entirety or substantially the entirety of each of the four side surfaces of the multilayer body 12. Thus, entry of noise into the inside of the electronic component 10a from the side surfaces of the electronic component 10a is significantly reduced or prevented and radiation of noise to outside of the electronic component 10a from the side surfaces of the electronic component 10a is significantly reduced or prevented. In addition, in the electronic component 10a, the ground conductor layers 50 and 52a to 52d are preferably provided closer to the top surface of the multilayer body 12 than the inductors L1 and L2 and the capacitors C1 to C5. The ground conductor layer 50 and the ground conductor layers 52a to 52d are collectively superposed with the entirety or substantially the entirety of the top surface of the multilayer body 12 when viewed from above. Thus, entry of noise into the inductors L1 and L2 and the capacitors C1 to C5 from the top surface of the electronic component 10a is significantly reduced or prevented and radiation of noise by the inductors L1 and L2 and the capacitors C1 to C5 from the top surface of the electronic component 10a is significantly reduced or prevented.

In addition, in the electronic component 10a, the ground conductor layer 50 preferably does not cover the entirety of the upper surface of the insulator layer 16b and the ground conductor layers 52a to 52d preferably do not cover the entirety of the upper surface of the insulator layer 16c. Therefore, the insulator layer 16a and the insulator layer 16b contact each other at portions where the ground conductor layer 50 does not exist. Similarly, the insulator layer 16b and the insulator layer 16c contact each other at portions where the ground conductor layers 52a to 52d do not exist. As a result, delamination between the insulator layer 16a and the insulator layer 16b and between the insulator layer 16b and the insulator layer 16c is significantly reduced or prevented.

Furthermore, with the electronic component 10a, suction failure for the electronic component 10a when mounting the electronic component 10a on a circuit board is significantly reduced or prevented. In more detail, the surface roughness of the shield electrode 13 is higher than the surface roughness of the multilayer body 12. Therefore, there is a risk of a suction failure occurring for the electronic component 10a when suction is applied to the shield electrode 13. Consequently, in the electronic component 10a, the shield electrode 13 is preferably not provided on the top surface of the multilayer body 12. Thus, suction is able to be applied to the top surface of the multilayer body 12 and suction failure for the electronic component 10a is significantly reduced or prevented.

Furthermore, in the electronic component 10a, the shield electrode 13 is preferably not provided on the top surface of the multilayer body 12 and therefore the orientation identifying mark 60 is able to be provided on the top surface of the multilayer body 12. Thus, the orientation of the electronic component 10a is able to be more easily be identified.

In addition, in the electronic component 10a, the shield electrode 13 is preferably not provided on the top surface of the multilayer body 12. Therefore, compared with an electronic component in which the top surface of the multilayer body 12 is covered by the shield electrode 13, the amount of contraction in the vicinity of the top surface of the multilayer body 12 and the amount of contraction in the vicinity of the bottom surface of the multilayer body 12 at the time of firing are the same or similar to each other in the electronic component 10a. As a result, warping in the electronic component 10a after firing is significantly reduced or prevented.

In addition, in the electronic component 10a, the attenuation outside of the pass band of the low pass filter can be made high. In more detail, in the electronic component 10a, the shield electrode 13 is connected to the outer electrode 14c, which is a ground outer electrode, and covers the side surfaces of the multilayer body 12. Consequently, the ground electrode (the shield electrode) is able to be made larger and therefore a parasitic inductance component is able to be reduced or prevented and as a result attenuation outside of the pass band of the low pass filter is improved.

Figure 3A:
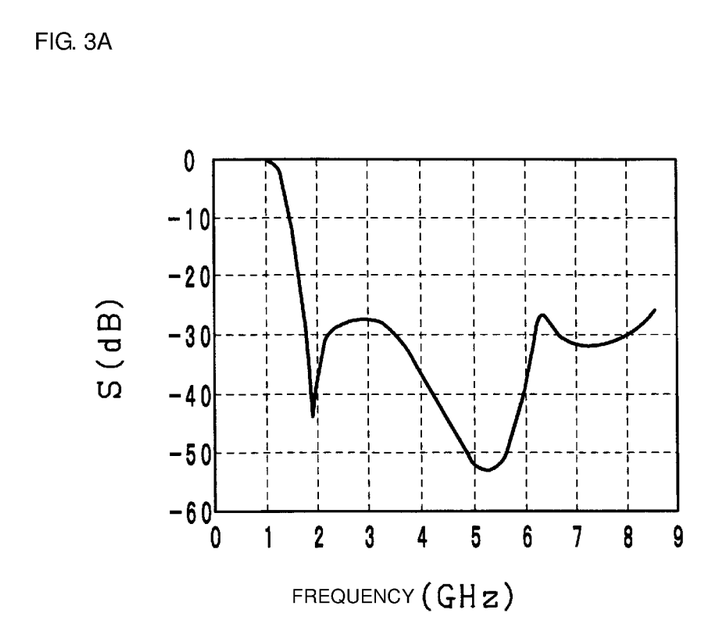
FIG. 3A is a graph illustrating simulation results.
Figure 3B:
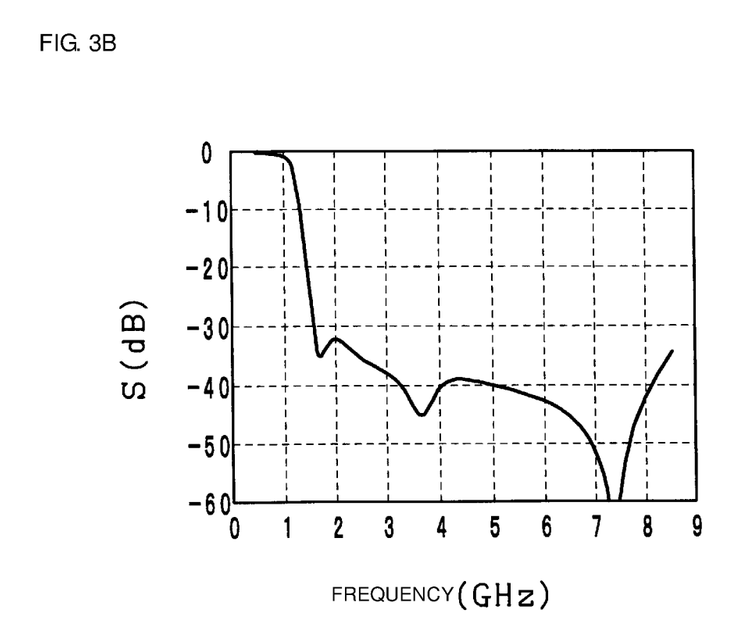
FIG. 3B is a graph illustrating simulation results.

Here, the inventors of the present application performed computer simulation described hereafter in order to confirm that attenuation outside of the pass band of the low pass filter is increased. The inventors of the present application created a first model (a comparative example) that is a model in which the shield electrode 13 is not provided in the electronic component 10a illustrated in FIGS. 1A, 1B and 2 and a second model (an example) that is a model of the electronic component 10a illustrated in FIGS. 1A, 1B and 2. The bandpass characteristics of the first and second model were calculated by a computer. FIG. 3A is a graph illustrating simulation results of the first model. FIG. 3B is a graph illustrating simulation results of a second model. The vertical axis represents the bandpass characteristics and the horizontal axis represents frequency.

Comparing FIG. 3A and FIG. 3B, it is clear that the attenuation in the band of 2 GHz and higher is greater in the second model than in the first model. Therefore, according to the computer simulation, it is clear that attenuation outside the pass band of the low pass filter is higher due to the shield electrode 13 being provided.

In addition, in the electronic component 10a, as a result of the shield electrode being used as a ground electrode, a parasitic inductance generated by the ground electrode is able to be reduced or prevented and therefore the attenuation outside the pass band is improved. Therefore, attenuation outside the pass band of the low pass filter is improved.

Additionally, the electronic component 10a is not required to include the ground conductor layers 50 and 52a to 52d (in particular, the ground conductor layers 52a to 52d).

Second Preferred Embodiment

Figure 4:
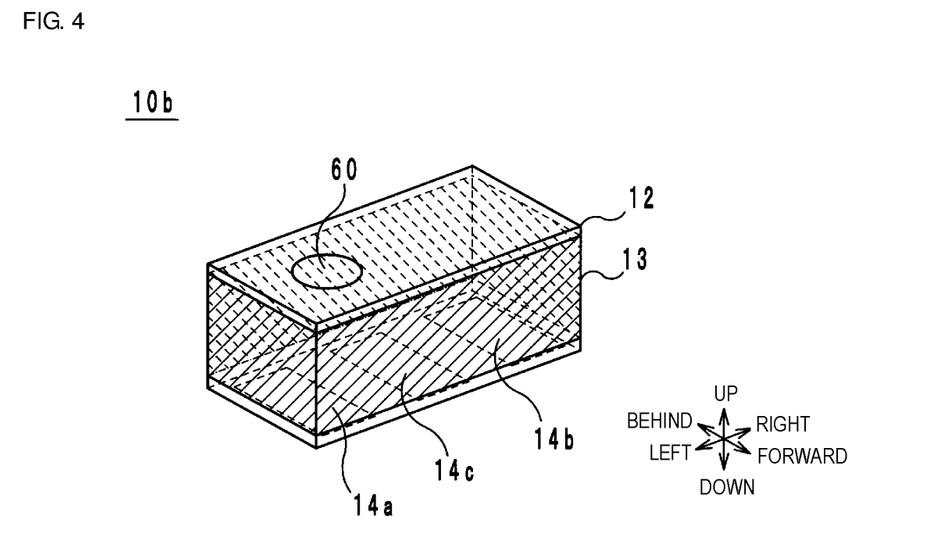
FIG. 4 is an external perspective view of an electronic component according to a second preferred embodiment of the present invention.

Hereafter, an electronic component according to a second preferred embodiment of the present invention will be described while referring to the drawings. FIG. 4 is an external perspective view of an electronic component 10b according to the second preferred embodiment of the present invention. An equivalent circuit diagram and an exploded perspective view of the electronic component 10b are the same or substantially the same as those of the electronic component 10a and therefore FIG. 1A and FIG. 2 will be referred to here.

The shape of the shield electrode 13 of the electronic component 10b is different from the shape of the shield electrode 13 of the electronic component 10a. Hereafter, the electronic component 10b will be described while focusing on this difference.

As illustrated in FIG. 4, in the electronic component 10b, the shield electrode 13 preferably does not extend up to the top surface and the bottom surface of the multilayer body 12. That is, there is a space between the shield electrode 13 and the top surface of the multilayer body and there is a space between the shield electrode 13 and the bottom surface of the multilayer body.

The electronic component 10b is able to exhibit the same or substantially the same operational effect as the electronic component 10a.

In addition, with the electronic component 10b, the occurrence of a situation in which the shield electrode 13 is formed on the top surface of the multilayer body 12 at the time of manufacture is significantly less likely or prevented. Thus, unevenness on the top surface of the multilayer body 12 is significantly reduced or prevented and suction failure for the electronic component 10b is significantly reduced or prevented.

In addition, with the electronic component 10b, the occurrence of a situation in which the shield electrode 13 is formed on the bottom surface of the multilayer body 12 at the time of manufacture is significantly less likely or prevented. As a result, short circuiting of the shield electrode 13 and the outer electrodes 14a to 14c is significantly reduced or prevented.

The shield electrode 13 preferably does not have to extend up to either of the top surface and the bottom surface of the multilayer body 12.

Third Preferred Embodiment

Figure 5:
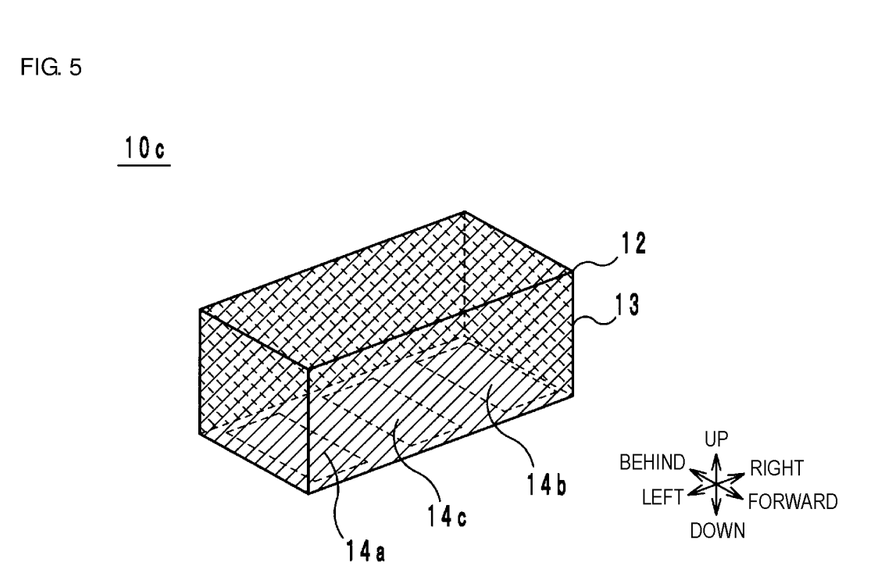
FIG. 5 is an external perspective view of an electronic component according to a third preferred embodiment of the present invention.

Hereafter, an electronic component according to a third preferred embodiment of the present invention will be described while referring to the drawings. FIG. 5 is an external perspective view of an electronic component 10c according to the third preferred embodiment of the present invention. An equivalent circuit diagram of the electronic component 10c is the same or substantially the same as the equivalent circuit diagram of the electronic component 10a and therefore FIG. 1A will be referred to.

The electronic component 10c differs from the electronic component 10a in terms of the shape of the shield electrode 13 and presence/absence of the ground conductor layers 50 and 52a to 52d. Hereafter, the electronic component 10c will be described while focusing on these differences.

As illustrated in FIG. 5, the shield electrode 13 is preferably also provided on the top surface of the multilayer body 12 in addition to the four side surfaces of the multilayer body 12. In this preferred embodiment of the present invention, the shield electrode 13 covers the entirety or substantially the entirety of the top surface of the multilayer body 12. The shield electrode 13 can be formed using a sputtering method, for example.

In addition, in the electronic component 10c, since the top surface of the multilayer body 12 is covered by the shield electrode 13, the ground conductor layers 50 and 52a to 52d and the insulator layers 16b and 16c are preferably not provided.

The thus-configured electronic component 10c is able to exhibit the same or substantially the same operational effect as the electronic component 10a.

In addition, the ground conductor layers 50 and 52a to 52d are preferably not needed in the electronic component 10c as a consequence of the shield electrode 13 being provided on the top surface of the multilayer body 12. Thus, the number of layers of the multilayer body 12 is able to be reduced and the profile of the multilayer body 12 is able to be reduced.

Fourth Preferred Embodiment

Figure 6:
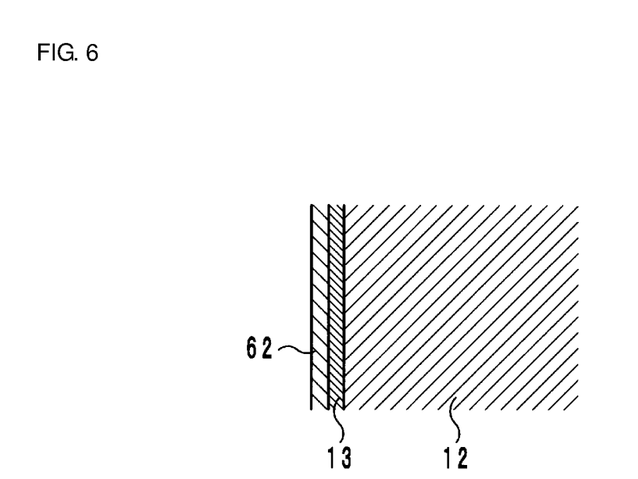
FIG. 6 is a sectional structural view of an electronic component according to a fourth preferred embodiment of the present invention.

Hereafter, an electronic component according to a fourth preferred embodiment of the present invention will be described while referring to the drawings. FIG. 6 is a sectional structural view of an electronic component 10d according to the fourth preferred embodiment of the present invention. An equivalent circuit diagram and an exploded perspective view of the electronic component 10d are the same or substantially the same as those of the electronic component 10a and therefore FIG. 1A and FIG. 2 will be referred to here.

The electronic component 10d differs from the electronic component 10a in that the electronic component 10d includes a resin layer 62. As illustrated in FIG. 6, the resin layer 62 covers the surface of the shield electrode 13.

In the electronic component 10d, the occurrence of a situation in which solder wets the shield electrode 13 is significantly less likely or prevented. In more detail, in the case where the shield electrode 13 is formed by applying a conductive paste, Ni plating and Sn plating are also formed on the surface of the shield electrode 13 when Ni plating and Sn plating are formed for the outer electrodes 14a to 14c. Since Ni plating and Sn plating are excellent in terms of wettability, the wettability of the shield electrode 13 is also improved. In other words, there is a possibility that solder will wet the side surfaces of the electronic component 10d.

Consequently, the resin layer 62 covers the surface of the shield electrode 13 in the electronic component 10d. The wettability of the resin layer 62 is low compared with that of Ni plating and Sn plating. Therefore, the occurrence of a situation in which the solder wets the resin layer 62 (i.e., the side surfaces of the electronic component 10d) is significantly reduced or prevented.

Other Preferred Embodiments

Electronic components according to the present invention are not limited to the electronic components 10a to 10d and may be changed within the scope of the gist of the present invention.

The features, elements, characteristics, etc. of the various preferred embodiments of the present invention of the electronic components 10a to 10d may be combined with each other, as appropriate.

A low pass filter is preferably built into the electronic components 10a to 10d as an example, but another circuit or passive element may be instead built into the electronic components 10a to 10d. The circuit that is built into the electronic components 10a to 10d is a circuit including a combination of passive elements. Therefore, active components are preferably not built into the electronic components 10a to 10d. Examples of passive elements that may be built into the electronic components 10a to 10d include coils, inductors, resistors and so on. In addition, examples of circuits that may be built into the electronic components 10a to 10d include diplexers, couplers, low pass filters, band pass filters and so on.

The electronic components 10a to 10d are so-called chip components and are preferably not module components. The term "chip component" refers to a small-sized electronic component in which a passive element or a circuit preferably including a combination of passive elements is preferably provided by using combinations of conductor layers, via hole conductors and so forth. Therefore, a module component formed by mounting an active component such as a semiconductor integrated circuit on a circuit board and sealing the semiconductor integrated circuit by using a resin is preferably not included in examples of chip components in the present application.

In addition, in the electronic component 10a, the ground conductor layers 52a to 52d may be connected together into a single ground conductor layer having an annular or substantially annular shape.

Preferred embodiments of the present invention are useful in electronic components and are particularly excellent in that the various preferred embodiments of the present invention enable an electronic component to be mounted on a circuit board so as to be close to or adjacent to other electronic components and in that an improved shielding effect is achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
 a main body having a rectangular or substantially rectangular parallelepiped shape;
 an inner conductor that is provided inside the main body;

one or more outer electrodes that are provided on a bottom surface of the main body and are not provided on four side surfaces of the main body; and a shield electrode that covers the four side surfaces of the main body and has a rectangular or substantially rectangular cylindrical shape; wherein the shield electrode is not physically connected to the one or more outer electrodes at a surface of the main body and is physically connected to the inner conductor at a surface of the main body; and the main body includes a stack of a plurality of insulator layers on top of one another in a stacking direction that connects the top surface and the bottom surface of the main body;

the plurality of insulator layers include a first insulator layer; and the electronic component further comprises;

one or more passive elements that are provided in the main body; and a first ground conductor that is provided on the first insulator layer, which is positioned closer to the top surface of the main body than the one or more passive elements.

2. The electronic component according to claim 1, wherein the one or more outer electrodes include an outer ground electrode that is connected to a ground potential; and the inner conductor electrically connects the shield electrode and the outer ground electrode.

3. The electronic component according to claim 1, wherein the shield electrode is provided on a top surface of the main body.

4. The electronic component according to claim 1, further comprising a resin layer that covers at least a portion of a surface of the shield electrode.

5. The electronic component according to claim 1, wherein the shield electrode is not provided on a top surface of the main body.

6. The electronic component according to claim 5, wherein the shield electrode does not extend up to the top surface and/or the bottom surface of the main body.

7. The electronic component according to claim 5, wherein a surface roughness of the shield electrode is higher than a surface roughness of the main body.

8. The electronic component according to claim 5, further comprising a conductor layer provided on the top surface of the main body.

9. The electronic component according to claim 5, wherein the plurality of insulator layers are dielectric layers.

10. The electronic component according to claim 5, wherein the plurality of insulator layers further include a second insulator layer, the second insulator layer being a different layer from the first insulator layer and being positioned closer to the top surface of the main body than the one or more passive elements; and the electronic component further comprises; a second ground conductor that is provided on the second insulator layer; wherein the first ground conductor covers a portion of the first insulator layer;

the second ground conductor covers a portion of the second insulator layer; and the first ground conductor and the second ground conductor are collectively superposed with an entirety or substantially an entirety of the top surface of the main body when viewed in the stacking direction.

11. The electronic component according to claim 10, wherein the first insulator layer and the second insulator layer contact each other at a portion of the second insulator layer where the second ground conductor does not cover the second insulator layer.

12. The electronic component according to claim 10, wherein the first ground conductor is exposed to a region outside the main body and is connected to the shield electrode.

13. The electronic component according to claim 10, wherein the first ground conductor is connected to the shield electrode at the four side surfaces of the main body.

14. The electronic component according to claim 10, wherein the second ground conductor includes ground conductor layers that are L shaped or substantially L shaped.

15. The electronic component according to claim 10, wherein the second ground conductor is exposed to a region outside the main body and is connected to the shield electrode.

16. The electronic component according to claim 10, wherein the second ground conductor is connected to the shield electrode at the four side surfaces of the main body.

17. The electronic component according to claim 10, wherein the electronic component is a chip component.

18. The electronic component according to claim 1, wherein the shield electrode is made of copper and stainless steel.

19. The electronic component according to claim 1, wherein the inner conductor is made of a material that is different a material from which the shield electrode is made.

20. The electronic component according to claim 1, wherein the inner conductor is made of copper and the shield electrode is made of copper and stainless steel.

* * * * *